US010287471B2

(12) United States Patent
Zhang et al.

(10) Patent No.: US 10,287,471 B2
(45) Date of Patent: May 14, 2019

(54) HIGH PERFORMANCE THERMAL INTERFACE MATERIALS WITH LOW THERMAL IMPEDANCE

(71) Applicant: Honeywell International Inc., Morris Plains, NJ (US)

(72) Inventors: Liqiang Zhang, Shanghai (CN); Ling Shen, Shanghai (CN); Hui Wang, Shanghai (CN); Ya Qun Liu, Shanghai (CN); Wei Jun Wang, Shanghai (CN); Hong Min Huang, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/531,253

(22) PCT Filed: Dec. 5, 2014

(86) PCT No.: PCT/CN2014/093138
§ 371 (c)(1),
(2) Date: May 26, 2017

(87) PCT Pub. No.: WO2016/086410
PCT Pub. Date: Jun. 9, 2016

(65) Prior Publication Data
US 2017/0321100 A1    Nov. 9, 2017

(51) Int. Cl.
*H01L 23/373* (2006.01)
*C09K 5/06* (2006.01)
*C09K 5/14* (2006.01)

(52) U.S. Cl.
CPC .............. *C09K 5/066* (2013.01); *C09K 5/063* (2013.01); *C09K 5/14* (2013.01); *H01L 23/3737* (2013.01); *H01L 2224/16225* (2013.01); *H01L 2224/73204* (2013.01); *H01L 2224/73253* (2013.01)

(58) Field of Classification Search
CPC ........ C09K 5/066; C09K 5/14; H01L 23/3737
USPC ............................ 257/717; 428/323; 361/708
See application file for complete search history.

(56) References Cited

U.S. PATENT DOCUMENTS

| | | |
|---|---|---|
| 1,655,133 A | 1/1928 | Clase |
| 4,180,498 A | 12/1979 | Spivack |
| 4,265,026 A | 5/1981 | Meyer |
| 4,446,266 A | 5/1984 | von Gentzkow et al. |
| 4,459,185 A | 7/1984 | Obata et al. |
| 4,565,610 A | 1/1986 | Nobel et al. |
| 5,162,555 A | 11/1992 | Remmers et al. |
| 5,167,851 A | 12/1992 | Jamison et al. |
| 5,562,814 A | 10/1996 | Kirby |
| 6,040,362 A | 3/2000 | Mine et al. |
| 6,096,414 A | 8/2000 | Young |
| 6,238,596 B1 | 5/2001 | Nguyen et al. |
| 6,339,120 B1 | 1/2002 | Misra et al. |
| 6,372,337 B2 | 4/2002 | Takahashi et al. |
| 6,372,997 B1 | 4/2002 | Hill et al. |
| 6,391,442 B1 | 5/2002 | Duvall et al. |
| 6,400,565 B1 | 6/2002 | Shabbir et al. |
| 6,432,320 B1 | 8/2002 | Bonsignore et al. |
| 6,432,497 B2 | 8/2002 | Bunyan |
| 6,451,422 B1 * | 9/2002 | Nguyen ................. B32B 27/12 106/270 |
| 6,475,962 B1 | 11/2002 | Khatri |
| 6,496,373 B1 | 12/2002 | Chung |
| 6,500,891 B1 | 12/2002 | Kropp et al. |
| 6,562,180 B1 | 5/2003 | Bohin et al. |
| 6,597,575 B1 | 7/2003 | Matayabas et al. |
| 6,605,238 B2 | 8/2003 | Nguyen et al. |
| 6,610,635 B2 | 8/2003 | Khatri |
| 6,616,999 B1 | 9/2003 | Freuler et al. |
| 6,617,517 B2 | 9/2003 | Hill et al. |
| 6,620,515 B2 | 9/2003 | Feng et al. |
| 6,624,224 B1 | 9/2003 | Misra |
| 6,649,325 B1 | 11/2003 | Gundale et al. |
| 6,657,297 B1 | 12/2003 | Jewram et al. |
| 6,673,434 B2 * | 1/2004 | Nguyen ................. B32B 27/12 428/323 |
| 6,706,219 B2 | 3/2004 | Nguyen |
| 6,761,928 B2 | 7/2004 | Hill et al. |
| 6,764,759 B2 | 7/2004 | Duvall et al. |
| 6,783,692 B2 | 8/2004 | Bhagwagar |
| 6,791,839 B2 | 9/2004 | Bhagwagar |
| 6,797,382 B2 | 9/2004 | Nguyen et al. |
| 6,797,758 B2 | 9/2004 | Misra et al. |

(Continued)

FOREIGN PATENT DOCUMENTS

| | | |
|---|---|---|
| CA | 2311067 A1 | 1/2001 |
| CN | 1407141 A | 4/2003 |

(Continued)

OTHER PUBLICATIONS

International Search Report and Written Opinion issued in PCT/US2017/041498, dated Oct. 20, 2017, 10 pages.
Ping, Ding, et al. "Preparation and Application Research of Novel Silicone Gel for High-Power IGBT." Insulating Materials, 47(2):52-55, Chinese text with English translation of Abstract, 2014.
"Hi-Flow 225F-AC Reinforced, Phase Change Thermal Interface Material," The Bergquist Company, 1 page, available it least as early as the filed of the present application.

(Continued)

*Primary Examiner* — Mohammed Shamsuzzaman
(74) *Attorney, Agent, or Firm* — Faegre Baker Daniels LLP

(57) ABSTRACT

A thermal interface material includes, in one exemplary embodiment, a polymer, a phase change material, a first thermally conductive filler having a first particle size, and a second thermally conductive filler having a second particle size. The first particle size is larger than the second particle size. A formulation for forming a thermal interface material and an electronic component including a thermal interface material are also provided.

15 Claims, 1 Drawing Sheet

(56) References Cited

U.S. PATENT DOCUMENTS

| | | | |
|---|---|---|---|
| 6,811,725 B2 | 11/2004 | Nguyen et al. | |
| 6,815,486 B2 | 11/2004 | Bhagwagar et al. | |
| 6,835,453 B2 | 12/2004 | Greenwood et al. | |
| 6,838,182 B2 | 1/2005 | Kropp et al. | |
| 6,874,573 B2 | 4/2005 | Collins et al. | |
| 6,900,163 B2 | 5/2005 | Khatri | |
| 6,913,686 B2 | 7/2005 | Hilgarth | |
| 6,926,955 B2 | 8/2005 | Jayaraman et al. | |
| 6,940,721 B2 | 9/2005 | Hill | |
| 6,946,190 B2 | 9/2005 | Bunyan | |
| 6,984,685 B2 | 1/2006 | Misra et al. | |
| 7,013,965 B2 | 3/2006 | Zhong et al. | |
| 7,056,566 B2 | 6/2006 | Freuler et al. | |
| 7,074,490 B2 | 7/2006 | Feng et al. | |
| 7,078,109 B2 | 7/2006 | Hill et al. | |
| 7,135,232 B2 | 11/2006 | Yamada et al. | |
| 7,147,367 B2 | 12/2006 | Balian et al. | |
| 7,172,711 B2 | 2/2007 | Nguyen | |
| 7,241,707 B2 | 7/2007 | Meagley et al. | |
| 7,244,491 B2 * | 7/2007 | Nguyen | B32B 27/12 106/270 |
| 7,291,396 B2 | 11/2007 | Huang et al. | |
| 7,294,394 B2 | 11/2007 | Jayaraman et al. | |
| RE39,992 E | 1/2008 | Misra et al. | |
| 7,328,547 B2 * | 2/2008 | Mehta | B65B 63/08 428/35.7 |
| 7,369,411 B2 | 5/2008 | Hill et al. | |
| 7,462,294 B2 | 12/2008 | Kumar et al. | |
| 7,465,605 B2 | 12/2008 | Raravikar et al. | |
| 7,550,097 B2 | 6/2009 | Tonapi et al. | |
| 7,572,494 B2 | 8/2009 | Mehta et al. | |
| 7,641,811 B2 | 1/2010 | Kumar et al. | |
| 7,682,690 B2 | 3/2010 | Bunyan et al. | |
| 7,695,817 B2 | 4/2010 | Lin et al. | |
| 7,700,943 B2 | 4/2010 | Raravikar et al. | |
| 7,744,991 B2 | 6/2010 | Fischer et al. | |
| RE41,576 E | 8/2010 | Bunyan et al. | |
| 7,816,785 B2 | 10/2010 | Iruvanti et al. | |
| 7,846,778 B2 | 12/2010 | Rumer et al. | |
| 7,850,870 B2 | 12/2010 | Ahn et al. | |
| 7,867,609 B2 | 1/2011 | Nguyen | |
| 7,955,900 B2 | 6/2011 | Jadhav et al. | |
| 7,960,019 B2 | 6/2011 | Jayaraman et al. | |
| 8,039,961 B2 | 10/2011 | Suhir et al. | |
| 8,076,773 B2 | 12/2011 | Jewram et al. | |
| 8,081,468 B2 | 12/2011 | Hill et al. | |
| 8,105,504 B2 | 1/2012 | Gerster et al. | |
| 8,110,919 B2 | 2/2012 | Jewram et al. | |
| 8,138,239 B2 | 3/2012 | Prack et al. | |
| 8,223,498 B2 | 7/2012 | Lima | |
| 8,308,861 B2 | 11/2012 | Rolland et al. | |
| 8,324,313 B2 | 12/2012 | Funahashi | |
| 8,373,283 B2 | 2/2013 | Masuko et al. | |
| 8,431,647 B2 | 4/2013 | Dumont et al. | |
| 8,431,655 B2 | 4/2013 | Dershem | |
| 8,445,102 B2 | 5/2013 | Strader et al. | |
| 8,518,302 B2 | 8/2013 | Gerster et al. | |
| 8,535,478 B2 | 9/2013 | Pouchelon et al. | |
| 8,535,787 B1 | 9/2013 | Lima | |
| 8,557,896 B2 | 10/2013 | Jeong et al. | |
| 8,586,650 B2 | 11/2013 | Zhang et al. | |
| 8,587,945 B1 * | 11/2013 | Hartmann | H05K 7/20454 361/679.53 |
| 8,618,211 B2 | 12/2013 | Bhagwagar et al. | |
| 8,632,879 B2 | 1/2014 | Weisenberger | |
| 8,633,478 B2 | 1/2014 | Cummings et al. | |
| 8,638,001 B2 | 1/2014 | Kimura et al. | |
| 8,647,752 B2 | 2/2014 | Strader et al. | |
| 8,758,892 B2 | 6/2014 | Bergin et al. | |
| 8,796,068 B2 | 8/2014 | Stender et al. | |
| 8,837,151 B2 | 9/2014 | Hill et al. | |
| 8,865,800 B2 | 10/2014 | Stammer et al. | |
| 8,917,510 B2 | 12/2014 | Boday et al. | |
| 8,937,384 B2 | 1/2015 | Bao et al. | |
| 9,055,694 B2 | 6/2015 | Lima | |
| 9,070,660 B2 | 6/2015 | Lowe et al. | |
| 9,080,000 B2 | 7/2015 | Ahn et al. | |
| 9,222,735 B2 | 12/2015 | Hill et al. | |
| 9,260,645 B2 | 2/2016 | Bruzda | |
| 9,392,730 B2 | 7/2016 | Hartmann et al. | |
| 9,481,851 B2 | 11/2016 | Matsumoto et al. | |
| 9,527,988 B2 | 12/2016 | Habimana et al. | |
| 9,537,095 B2 | 1/2017 | Stender et al. | |
| 9,593,209 B2 | 3/2017 | Dent et al. | |
| 9,593,275 B2 | 3/2017 | Tang et al. | |
| 9,598,575 B2 | 3/2017 | Bhagwagar et al. | |
| 2002/0018885 A1 | 2/2002 | Takahashi et al. | |
| 2002/0132896 A1 * | 9/2002 | Nguyen | B32B 27/12 524/404 |
| 2003/0112603 A1 | 6/2003 | Roesner et al. | |
| 2003/0151030 A1 | 8/2003 | Gurin | |
| 2003/0159938 A1 | 8/2003 | Hradil | |
| 2003/0203181 A1 | 10/2003 | Ellsworth et al. | |
| 2003/0207064 A1 | 11/2003 | Bunyan et al. | |
| 2003/0207128 A1 | 11/2003 | Uchiya et al. | |
| 2003/0230403 A1 | 12/2003 | Webb | |
| 2004/0069454 A1 | 4/2004 | Bonsignore et al. | |
| 2004/0149587 A1 | 8/2004 | Hradil | |
| 2004/0161571 A1 | 8/2004 | Duvall et al. | |
| 2004/0206941 A1 | 10/2004 | Gurin | |
| 2005/0020738 A1 | 1/2005 | Jackson et al. | |
| 2005/0072334 A1 | 4/2005 | Czubarow et al. | |
| 2005/0148721 A1 | 7/2005 | Tonapi et al. | |
| 2005/0228097 A1 | 10/2005 | Zhong | |
| 2005/0287362 A1 | 12/2005 | Garcia-Ramirez et al. | |
| 2006/0208354 A1 | 9/2006 | Liu et al. | |
| 2006/0228542 A1 | 10/2006 | Czubarow | |
| 2006/0260948 A2 | 11/2006 | Zschintzsch et al. | |
| 2006/0264566 A1 | 11/2006 | Cassar et al. | |
| 2007/0051773 A1 | 3/2007 | Ruchert et al. | |
| 2007/0097651 A1 | 5/2007 | Canale et al. | |
| 2007/0131913 A1 | 6/2007 | Cheng et al. | |
| 2007/0161521 A1 | 7/2007 | Sachdev et al. | |
| 2007/0164424 A1 | 7/2007 | Dean et al. | |
| 2007/0179232 A1 | 8/2007 | Collins et al. | |
| 2007/0249753 A1 | 10/2007 | Lin et al. | |
| 2008/0044670 A1 | 2/2008 | Nguyen | |
| 2008/0141629 A1 | 6/2008 | Alper et al. | |
| 2008/0149176 A1 | 6/2008 | Sager et al. | |
| 2008/0291634 A1 | 11/2008 | Weiser et al. | |
| 2008/0302064 A1 | 12/2008 | Rauch | |
| 2009/0111925 A1 | 4/2009 | Burnham et al. | |
| 2009/0184283 A1 | 7/2009 | Chung et al. | |
| 2010/0048435 A1 | 2/2010 | Yamagata et al. | |
| 2010/0048438 A1 | 2/2010 | Carey et al. | |
| 2010/0075135 A1 | 3/2010 | Kendall et al. | |
| 2010/0129648 A1 | 5/2010 | Xu et al. | |
| 2010/0197533 A1 | 8/2010 | Kendall et al. | |
| 2011/0121435 A1 | 5/2011 | Mitsukura et al. | |
| 2011/0141698 A1 | 6/2011 | Chiou et al. | |
| 2011/0187009 A1 | 8/2011 | Masuko et al. | |
| 2011/0204280 A1 | 8/2011 | Bruzda | |
| 2011/0265979 A1 | 11/2011 | Chen et al. | |
| 2011/0294958 A1 | 12/2011 | Ahn et al. | |
| 2011/0308782 A1 | 12/2011 | Merrill et al. | |
| 2012/0060826 A1 | 3/2012 | Weisenberger | |
| 2012/0195822 A1 | 8/2012 | Werner et al. | |
| 2012/0253033 A1 | 10/2012 | Boucher et al. | |
| 2012/0285673 A1 | 11/2012 | Cola et al. | |
| 2012/0288725 A1 | 11/2012 | Tanaka et al. | |
| 2013/0199724 A1 | 8/2013 | Dershem | |
| 2013/0248163 A1 | 9/2013 | Bhagwagar et al. | |
| 2013/0265721 A1 | 10/2013 | Strader et al. | |
| 2013/0288462 A1 | 10/2013 | Stender et al. | |
| 2013/0299140 A1 | 11/2013 | Ling et al. | |
| 2014/0190672 A1 | 7/2014 | Swaroop et al. | |
| 2015/0125646 A1 | 5/2015 | Tournilhac et al. | |
| 2015/0138739 A1 | 5/2015 | Hishiki | |
| 2015/0158982 A1 | 6/2015 | Saito et al. | |
| 2015/0275060 A1 | 10/2015 | Kuroda et al. | |
| 2015/0279762 A1 | 10/2015 | Lowe et al. | |
| 2016/0160102 A1 | 6/2016 | Minegishi et al. | |
| 2016/0160104 A1 | 6/2016 | Bruzda et al. | |
| 2016/0272839 A1 | 9/2016 | Yamamoto et al. | |

(56) References Cited

U.S. PATENT DOCUMENTS

| | | | |
|---|---|---|---|
| 2017/0009362 A1 | 1/2017 | Werner et al. | |
| 2017/0107415 A1 | 4/2017 | Shiono | |
| 2017/0137685 A1 | 5/2017 | Liu et al. | |
| 2017/0167716 A1 | 6/2017 | Ezaki et al. | |
| 2017/0226396 A1* | 8/2017 | Yang | C09K 5/10 |
| 2017/0317257 A1 | 11/2017 | Ezaki et al. | |
| 2018/0030327 A1 | 2/2018 | Zhang et al. | |
| 2018/0030328 A1 | 2/2018 | Zhang et al. | |
| 2018/0085977 A1 | 3/2018 | Ezaki | |
| 2018/0194982 A1 | 7/2018 | Ezaki et al. | |

FOREIGN PATENT DOCUMENTS

| | | |
|---|---|---|
| CN | 1456710 A | 11/2003 |
| CN | 1549875 A | 11/2004 |
| CN | 101067030 A | 11/2007 |
| CN | 101090922 B | 12/2007 |
| CN | 101445627 A | 6/2009 |
| CN | 101735619 B | 6/2010 |
| CN | 101835830 B | 9/2010 |
| CN | 102134474 B | 7/2011 |
| CN | 102341474 B | 2/2012 |
| CN | 102627943 A | 8/2012 |
| CN | 102348763 B | 4/2013 |
| CN | 103087389 A | 5/2013 |
| CN | 103102689 A | 5/2013 |
| CN | 103131138 B | 6/2013 |
| CN | 103214848 A | 7/2013 |
| CN | 103254647 A | 8/2013 |
| CN | 103333447 A | 10/2013 |
| CN | 103409116 B | 11/2013 |
| CN | 103436027 B | 12/2013 |
| CN | 103709757 A | 4/2014 |
| CN | 103773322 A | 5/2014 |
| CN | 103849356 A | 6/2014 |
| CN | 103865271 B | 6/2014 |
| CN | 104098914 A | 10/2014 |
| CN | 104140678 B | 11/2014 |
| CN | 104449550 A | 3/2015 |
| CN | 104497574 A | 4/2015 |
| CN | 104804705 A | 7/2015 |
| CN | 104861661 A | 8/2015 |
| CN | 105111750 A | 12/2015 |
| CN | 105349113 A | 2/2016 |
| CN | 105838322 A | 8/2016 |
| CN | 105980512 A | 9/2016 |
| EP | 1224669 B1 | 7/2002 |
| EP | 1149519 B1 | 11/2004 |
| EP | 1514956 B1 | 3/2005 |
| EP | 1629059 B1 | 3/2006 |
| EP | 2194165 A1 | 6/2010 |
| FR | 2848215 A1 | 6/2004 |
| GB | 2508320 B | 5/2014 |
| JP | 57027188 B | 6/1982 |
| JP | 3662715 B2 | 1/1991 |
| JP | 02611364 B2 | 5/1997 |
| JP | 2000143808 A | 5/2000 |
| JP | 2001139818 A | 5/2001 |
| JP | 2002003830 A | 1/2002 |
| JP | 100479857 B1 | 7/2003 |
| JP | 2007002002 A | 1/2007 |
| JP | 4016326 B2 | 12/2007 |
| JP | 2008063412 A | 3/2008 |
| JP | 5269366 B2 | 3/2009 |
| JP | 2009102577 A | 5/2009 |
| JP | 5137538 B2 | 6/2009 |
| JP | 2009138036 A | 6/2009 |
| JP | 4288469 B2 | 7/2009 |
| JP | 5607298 B2 | 3/2010 |
| JP | 5390202 B2 | 8/2010 |
| JP | 2010248277 A | 11/2010 |
| JP | 2010278115 A | 12/2010 |
| JP | 5318733 B2 | 6/2011 |
| JP | 2011165792 A | 8/2011 |
| JP | 5687167 B2 | 4/2013 |
| JP | 5463116 B2 | 4/2014 |
| JP | 5944306 B2 | 7/2014 |
| JP | 5372270 B1 | 9/2014 |
| JP | 2014194006 A | 10/2014 |
| KR | 20070116654 A | 12/2007 |
| TW | 201527309 A | 7/2015 |
| WO | WO0120618 A1 | 3/2001 |
| WO | 2003064148 A1 | 8/2003 |
| WO | 2004008497 A2 | 1/2004 |
| WO | 2004022330 A1 | 3/2004 |
| WO | 200511146 A1 | 11/2005 |
| WO | 2005119771 A1 | 12/2005 |
| WO | 2007027670 A1 | 3/2007 |
| WO | 2008014171 A2 | 1/2008 |
| WO | 2008121491 A1 | 10/2008 |
| WO | 2008121970 A1 | 10/2008 |
| WO | 2009032212 A1 | 3/2009 |
| WO | 2013191116 A1 | 12/2013 |
| WO | 2014160067 A1 | 10/2014 |
| WO | 2015179056 A1 | 11/2015 |
| WO | 2016004565 A1 | 1/2016 |
| WO | 2016103424 A1 | 6/2016 |
| WO | WO2018068222 A1 | 4/2018 |

OTHER PUBLICATIONS

"THERM-A-GAP HCS10,569,570,579 and 580 Thermally Conductive Gap Filler Pads," Parker Chomerics, Engineering Your Success, pp. 11-12, available at least as early as the filed of the present application.

Aranzabe, Estibaliz, et al. "More than Color: Pigments with Thermal Storage Capacity; Processing and Degradation Behavior." Advances in Materials Physics and Chemistry, 5:171-184, 2015.

Extended European Search Report issued in EP Application 14867847. 7, dated Jun. 26, 2017, 7 pages.

International Search Report and Written Opinion issued in PCT/CN2014/081724, dated Apr. 1, 2015, 12 pages.

International Search Report and Written Opinion issued in PCT/CN2016/101874, dated Apr. 28, 2017, 12 pages.

International Search Report and Written Opinion issued in PCT/US2014/068033, dated Mar. 26, 2015, 12 pages.

Martyak et al., On the oxidation of tin(II) in methanesulfonate solutions and the role of sulfate, Galvanotechnik (2005), 96(3), 594-601 (Abstract).

Search Report issued in CN application 201480066502.2, dated May 18, 2017, 2 pages.

Gowda, Arun, et al. "Choosing the Right Thermal Interface Material." Solid State Technology, Insights for Electronics Manufacturing, Online Blog, 9 pages, 2005. Retrieved May 25, 2017 from the Internet <http://electroiq.com/blog/2005/03/choosing-the-right-thermal-interface-material/.

International Search Report and Written Opinion issued in PCT/CN2014/093138, dated Sep. 6, 2015, 8 pages.

Ramaswamy, C., et al. "Phase Change Materials as a Viable Thermal Interface Material for High-Power Electronic Applications." The Ninth Intersociety Conference on Thermal and Thermomechanical Phenomena in Electronic Systems, IEEE, 2:687-691, 2004.

"Dynasylan 1146: Oligomeric Diamino-Silane-System" Evonik Industries, pp. 1-3, 2008.

"Semicosil 9212A." Wacker Silicones Material Safety Data Sheet, pp. 1-8, printed Dec. 11, 2009.

"Semicosil 9212B." Wacker Silicones Material Safety Data Sheet, pp. 1-8, printed Dec. 11, 2009.

Extended European Search Report issued in EP Application No. 14897036.1, dated Jul. 2, 2018, 7 pages.

Extended Search Report issued in EP Application 14907530.1, dated Jun. 27, 2018, 9 pages.

Fink, Johannes Karl. "Chapter 18: Metal Deactivators." in: A Concise Introduction to Additives for Thermoplastic Polymers, Wiley-Scrivener, pp. 165-171, Jan. 1, 2010.

Singaporean Search Report and Written Opinion issued in SG Application No. 11201704238Y, completed May 18, 2018, 9 pages.

* cited by examiner

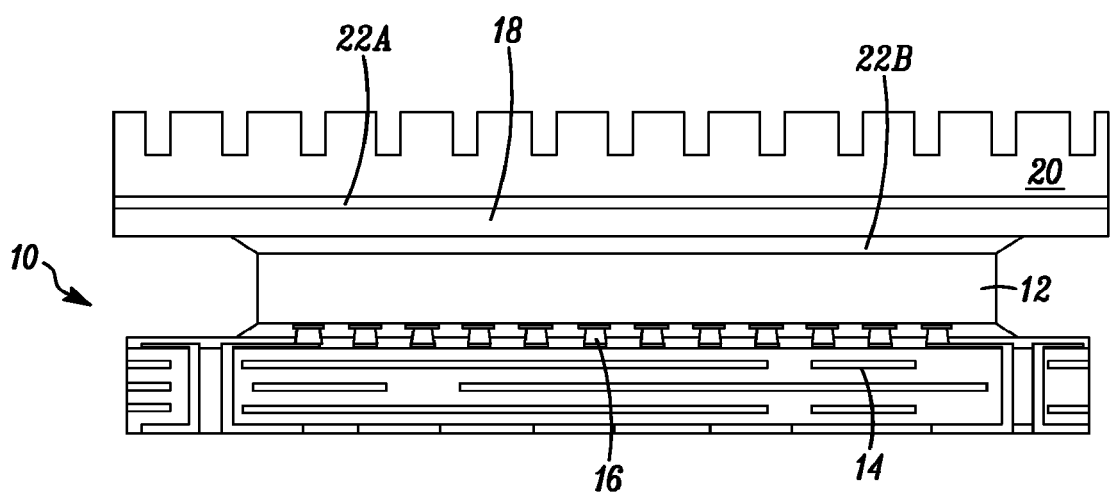

HIGH PERFORMANCE THERMAL INTERFACE MATERIALS WITH LOW THERMAL IMPEDANCE

CROSS-REFERENCE TO RELATED APPLICATION

This application is the U.S. national stage of PCT/CN2014/093138, published as WO2016/086410, filed Dec. 5, 2014, which is hereby incorporated by reference in its entirety.

FIELD OF THE INVENTION

The present disclosure relates generally to thermal interface materials, and more particularly to thermal interface materials including a phase change material.

DESCRIPTION OF RELATED ART

Thermal interface materials are widely used to dissipate heat from electronic components, such as central processing units, video graphics arrays, servers, game consoles, smart phones, LED boards, and the like. Thermal interface materials are typically used to transfer excess heat from the electronic component to a heat spreader, then transfer heat to a heat sink.

FIG. 1 schematically illustrates an electronic chip 10, including a silicon die 12, a printed circuit board 14, and a plurality of flip chip joints 16 on the printed circuit board 14. The electronic chip 10 is illustratively connected to a heat spreader 18 and a heat sink 20 by one or more first thermal interface materials (TIM) 22. As illustrated in FIG. 1, a first TIM 22A connects the heat sink 20 and heat spreader 18 and a second TIM 22B connects the heat spreader 18 and silicon die 12 of electronic chip 10. One or both of thermal interface materials 22A, 22B may be a thermal interface material as described below.

TIM 22A is designated as a TIM 2 and is positioned between a heat spreader 18 and a heat sink 20, such that a first surface of TIM 22A is in contact with a surface of heat spreader 18 and a second surface of TIM 22A is in contact with a surface of heat sink 20.

TIM 22B is designated as a TIM 1 and is positioned between an electronic chip 10 and a heat spreader 18 such that a first surface of TIM 22B is in contact with a surface of electronic chip 34, such as a surface of silicon die 12, and a second surface of TIM 22B is in contact with a surface of heat spreader 18.

In some embodiments (not shown), the TIM 22 is designated as a TIM 1.5 and positioned between an electronic chip 10 and a heat sink 20, such that a first surface of TIM 22 is in contact with a surface of electronic chip 10, such as a surface of silicon die 12, and a second surface of TIM 2 is in contact with a surface of heat sink 22.

Thermal interface materials include thermal grease, grease-like materials, elastomer tapes, and phase change materials. Traditional thermal interface materials include components such as gap pads and thermal pads. Exemplary thermal interface materials are disclosed in the following patents and applications, the disclosures of which are hereby incorporated by reference in their entirety: CN 103254647, CN 103254647, JP 0543116, U.S. Pat. Nos. 6,238,596, 6,451,422, 6,500,891, 6,605,238, 6,673,434, 6,706,219, 6,797,382, 6,811,725, 6,874,573, 7,172,711, 7,147,367, 7,244,491, 7,867,609, 8,324,313, 8,586,650, U.S. 2005/0072334, U.S.2007/0051773, U.S. 2007/0179232, U.S. 2008/0044670, U.S. 2009/0111925, U.S. 2010/0048438, U.S.2010/0129648, U.S. 2011/0308782, US 2013/0248163, and WO 2008/121491.

Thermal greases and phase change materials have lower thermal resistance than other types of thermal interface materials because of the ability to be spread in very thin layers and provide intimate contact between adjacent surfaces. However, a drawback of thermal grease is that thermal performance deteriorates significantly after thermal cycling, such as from 65° C. to 150° C., or after power cycling when used in VLSI ("very-large-scale-integration") chips. It has also been found that the performance of these materials deteriorates when large deviations from surface planarity causes gaps to form between the mating surfaces in the electronic devices or when large gaps between mating surfaces are present for other reasons, such as manufacturing tolerances, etc. When the heat transferability of these materials breaks down, the performance of the electronic device in which they are used is adversely affected. In addition, the silicone oil in the grease evaporates out of the grease and damage other parts of the electronic device.

In some embodiments it is also desirable for thermal interface materials to have excellent thermal performance and thermal stability.

SUMMARY OF THE INVENTION

The present disclosure provides thermal interface materials that are useful in transferring heat from heat generating electronic devices, such as computer chips, to heat dissipating structures, such as heat spreaders and heat sinks. The thermal interface materials illustratively include at least one phase change material, at least one polymer matrix material, at least one first thermally conductive filler having a first particle size, and at least one second thermally conductive filler having a second particle size, wherein the first particle size is larger than the second particle size.

In one more particular embodiment, a thermal interface material is provided. The thermal interface material includes at least one polymer, at least one phase change material, a first thermally conductive filler having a first particle size, and a second thermally conductive filler having a second particle size. In one embodiment, the first particle size is larger than the second particle size.

In one more particular embodiment of any of the above embodiments, the first thermally conductive filler comprises aluminum particles. In another more particular embodiment of any of the above embodiments, the second thermally conductive filler comprises zinc oxide particles.

In one more particular embodiment of any of the above embodiments, the first particle size is from about 1 microns to about 25 microns. In one more particular embodiment of any of the above embodiments, the first particle size is from about 3 microns to about 15 microns. In one more particular embodiment of any of the above embodiments, the first particle size is from about 3 microns to about 10 microns. In one more particular embodiment of any of the above embodiments, the second particle size is from about 0.1 microns to about 3 microns. In another more particular embodiment of any of the above embodiments, the second particle size is form about 0.1 microns to about 1 micron.

In one more particular embodiment, of any of the above embodiments, the first particle comprises aluminum and has a first particle size is from about 1 microns to about 15 microns and the second particle comprises zinc oxide and has a second particle size is from 0.1 microns to about 1 micron.

In one more particular embodiment of any of the above embodiments, the thermal interface material further includes a third thermally conductive filler having a third particle size, the second particle size being larger than the third particle size. In a still more particular embodiment, the third particle size is from about 10 nm to about 100 nm.

In one more particular embodiment of any of the above embodiments, the thermal interface material further includes at least one coupling agent, such as a titanate coupling agent. In another more particular embodiment of any of the above embodiments, the thermal interface material further includes at least one antioxidant. In another more particular embodiment of any of the above embodiments, the thermal interface material further includes at least one ion scavenger. In another more particular embodiment of any of the above embodiments, the thermal interface material further includes at least one crosslinker.

In another embodiment, a formulation for forming a thermal interface material is provided. The formulation includes a solvent, at least one phase change material, at least one polymer matrix material, at least one first thermally conductive filler having a first particle size, and at least one second thermally conductive filler having a second particle size, wherein the first particle size is larger than the second particle size. In a more particular embodiment, the formulation further includes a third thermally conductive filler having a third particle size; wherein the second particle size is larger than the third particle size.

In another embodiment, an electronic component is provided. The electronic component includes a heat sink, an electronic chip, and a thermal interface material positioned between the heat sink and electronic chip, the thermal interface material including: at least one phase change material, at least one polymer matrix material, at least one first thermally conductive filler having a first particle size, and at least one second thermally conductive filler having a second particle size, wherein the first particle size is larger than the second particle size. In a more particular embodiment, a first surface of the thermal interface material is in contact with a surface of the electronic chip and a second surface of the thermal interface material is in contact with the heat sink. In another more particular embodiment, the electronic component includes a heat spreader positioned between the heat sink and the electronic chip, wherein a first surface of the thermal interface material is in contact with a surface of the electronic chip and a second surface of the thermal interface material is in contact with the heat spreader. In still yet another more particular embodiment, the electronic component includes a heat spreader positioned between the heat sink and the electronic chip, wherein a first surface of the thermal interface material is in contact with a surface of the heat spreader and a second surface of the thermal interface material is in contact with the heat sink.

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein:

FIG. 1 schematically illustrates an electronic chip, a heat spreader, a heat sink, and first and second thermal interface materials.

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION

The present invention relates to thermal interface materials useful in transferring heat away from electronic components.

A. Thermal Interface Material

In one exemplary embodiment, the TIM 22 is a thermal interface material. In some exemplary embodiments, TIM 22 comprises one or more phase change materials, one or more polymer matrix materials, two or more thermally conductive fillers, and, optionally, one or more additives.

a. Thermally Conductive Filler

In some exemplary embodiments, the TIM 22 includes at least a first thermally conductive filler and a second thermally conductive filler.

Exemplary thermally conductive fillers include metals, alloys, nonmetals, metal oxides, metal nitrides and ceramics, and combinations thereof. Exemplary metals include but are not limited to aluminum, copper, silver, zinc, nickel, tin, indium, lead, silver coated metals such as silver coated copper or silver coated aluminum, metal coated carbon fibers, and nickel coated fibers. Exemplary nonmetals include but are not limited to carbon, carbon black, graphite, carbon nanotubes, carbon fibers, graphene, powdered diamond, glass, silica, silicon nitride, and boron coated particles. Exemplary metal oxides, metal nitrides and ceramics include but are not limited to alumina, aluminum nitride, boron nitride, zinc oxide, and tin oxide.

The TIM 22 may comprise the two or more thermally conductive fillers in an amount as little as 10 wt. %, 25 wt. %, 50 wt. %, 75 wt. %, 80 wt. %, 85 wt. %, as great as 90 wt. %, 92 wt. %, 95 wt. %, 97 wt. %, 98 wt. %, 99 wt. %, or within any range defined between any two of the foregoing values, based on the total weight of the TIM 22.

The thermally conductive fillers may be provided as particles. Average particle diameter (D50) is commonly used to measure particle size. Illustrative particles have average particle diameters as little as 10 nm, 20 nm, 50 nm, 0.1 microns, 0.2 microns, 0.5 microns, 1 micron, 2 microns, 3 microns, as great as 5 microns, 8 microns, 10 microns, 12 microns, 15 microns 20 microns, 25 microns, 50 microns, 100 microns, or within any range defined between any two of the foregoing values.

In one embodiment, the thermally conductive fillers have different particle sizes to increase the packing effect between filler particles. In some embodiments, the first and second thermally conductive fillers are two different types of thermally conductive fillers having different particle sizes. In some embodiments, the first and second thermally conductive fillers are the same thermally conductive filler, but have different particle sizes.

In one exemplary embodiment, each thermally conductive filler has a D50 value that differs from the D50 of the remaining thermally conductive fillers by at least a certain factor. Exemplary factors may be as little as 1, 2, 3, 5, as great as 10, 20, 50, or 100. Without wishing to be bound by any particular theory, it is believed that in some embodiments, particle size distribution is also important for packing density, in addition to average particle diameter.

1. First Thermally Conductive Filler

In one exemplary embodiment, the thermally conductive filler includes a first thermally conductive filler. In one exemplary embodiment, the first thermally conductive filler is a metal, such as aluminum, copper, silver, zinc, nickel, tin, indium, or lead. In a more particular embodiment, the first thermally conductive filler is aluminum.

In one exemplary embodiment, the first thermally conductive filler comprises particles having a size as little as 1 micron 2 microns, 3 microns, 5 microns, 8 microns, as great as 10 microns, 12 microns, 15 microns, 20 microns, 25 microns, 50 microns, 100 microns, or within any range defined between any two of the foregoing values. In one more particular embodiment, the first thermally conductive filler has a particle size from about 1 to about 25 microns. In one more particular embodiment, the first thermally conductive filler has a particle size from about 3 to about 5 microns. In one more particular embodiment, the first thermally conductive filler has a particle size from about 3 to about 15 microns. In one more particular embodiment, the first thermally conductive filler has a particle size from about 8 to about 12 microns. In one more particular embodiment, the first thermally conductive filler has a particle size from about 3 to about 10 microns. In one more particular embodiment, the first thermally conductive filler has a particle size of about 3 microns. In one more particular embodiment, the first thermally conductive filler has a particle size of about 10 microns.

The TIM 22 may comprise the first thermally conductive filler in an amount as little as 10 wt. %, 25 wt. %, 50 wt. %, 75 wt. %, 80 wt. %, 85 wt. %, as great as 90 wt. %, 92 wt. %, 95 wt. %, 97 wt. %, 98 wt. %, 99 wt. %, or within any range defined between any two of the foregoing values, based on the total weight of the TIM 22.

2. Second Thermally Conductive Filler

In one exemplary embodiment, the thermally conductive filler includes a first thermally conductive filler as described above and a second thermally conductive filler. In one exemplary embodiment, the first thermally conductive filler has a particle size larger than a particle size of the second thermally conductive filler. In one exemplary embodiment, the first and second thermally conductive material are different sized particles of the same material. In another exemplary embodiment, the first and second thermally conductive material are different sized particles of different materials.

In one exemplary embodiment, the second thermally conductive filler is a metal, such as aluminum, copper, silver, zinc, nickel, tin, indium, or lead. In a more particular embodiment, the second thermally conductive filler is aluminum.

In another exemplary embodiment, the second thermally conductive filler is metal oxide, such as alumina, aluminum nitride, boron nitride, zinc oxide, or tin oxide. In a more particular embodiment, the second thermally conductive filler is zinc oxide.

In one exemplary embodiment, the second thermally conductive filler comprises particles having a size as little as 10 nm, 20 nm, 50 nm, 0.1 microns, 0.2 microns, 0.5 microns, 0.6 microns, 0.7 microns, 0.8 microns, 0.9 microns, 1 micron, 2 microns, 3 microns, as great as 5 microns, 8 microns, 10 microns, 12 microns, 15 microns, 20 microns, 25 microns, 50 microns, 100 microns, or within any range defined between any two of the foregoing values. In one more particular embodiment, the second thermally conductive filler has a particle size from about 1 to about 5 microns. In a more particular embodiment, the second thermally conductive filler has a particle size of about 3 microns. In one more particular embodiment, the second thermally conductive material has a particle size from about 0.1 microns to about 1 micron. In a more particular embodiment, the second thermally conductive filler has a particle size of about 0.5 microns to 1 micron. In a more particular embodiment, the second thermally conductive filler has a particle size of about 0.2 microns.

The TIM 22 may comprise the second thermally conductive fillers in an amount as little as 10 wt. %, 25 wt. %, 50 wt. %, 75 wt. %, 80 wt. %, 85 wt. %, as great as 90 wt. %, 92 wt. %, 95 wt. %, 97 wt. %, 98 wt. %, 99 wt. %, or within any range defined between any two of the foregoing values, based on the total weight of the TIM 22.

The TIM 22 may comprise a ratio of the first thermally conductive filler to the second thermally conductive filler in an amount as little as 1:50, 1:10, 1:5, 1:3, 1:1, as great as 2:1, 3:1, 5:1, 10:1, 20:1, 50:1, or within any range defined between any of the foregoing values, such as from 1:50 to 50:1, from 1:10 to 10:1, or from 1:5 to 5:1.

3. Third Thermally Conductive Filler

In one exemplary embodiment, the thermally conductive filler includes a first thermally conductive filler and a second thermally conductive filler as described above, and a third thermally conductive filler. In one exemplary embodiment, the first thermally conductive filler has a particle size larger than a particle size of the second thermally conductive filler, and the second thermally conductive filler has a particle size larger than a particle size of the third thermally conductive filler.

In one exemplary embodiment, the first, second, and third thermally conductive materials are different sized particles of the same material. In another exemplary embodiment, each of the first, second, and third thermally conductive materials are different sized particles of different materials. In still another exemplary embodiment, exactly two of the first, second, and third thermally conductive materials are different sized particles of the same material, and the remaining thermally conductive material is a different material.

In one exemplary embodiment, the third thermally conductive filler is a metal, such as aluminum, copper, silver, zinc, nickel, tin, indium, or lead. In a more particular embodiment, the third thermally conductive filler is aluminum.

In another exemplary embodiment, the third thermally conductive filler is metal oxide, such as alumina, aluminum nitride, boron nitride, zinc oxide, or tin oxide. In a more particular embodiment, the second thermally conductive filler is zinc oxide.

In still another exemplary embodiment, the third thermally conductive filler is selected from the group consisting of graphene, graphite, and carbon nanotubes.

In one exemplary embodiment, the third thermally conductive filler comprises particles having a size as little as 10 nm, 20 nm, 50 nm, 0.1 microns, 0.2 microns, as great as 0.5 microns, 0.6 microns, 0.7 microns, 0.8 microns, 0.9 microns, 1 micron or within any range defined between any two of the foregoing values. In another more particular embodiment, the third thermally conductive filler has a particle size from about 0.1 microns to about 1 micron. In a more particular embodiment, the second thermally conductive filler has a particle size of about 0.5 microns to 1 micron. In a more particular embodiment, the second thermally conductive filler has a particle size of about 0.2 microns. In another more particular embodiment, the third thermally conductive filler has a particle size from about 10 nm to about 0.1 microns. In a more particular embodiment, the third thermally conductive filler has a particle size of about 10 nm to about 50 nm.

The TIM 22 may comprise the third thermally conductive fillers in an amount as little as 10 wt. %, 25 wt. %, 50 wt. %, 75 wt. %, 80 wt. %, 85 wt. %, as great as 90 wt. %, 92 wt. %, 95 wt. %, 97 wt. %, 98 wt. %, 99 wt. %, or within any range defined between any two of the foregoing values, based on the total weight of the TIM 22.

The TIM 22 may comprise a ratio of the first thermally conductive filler to the second thermally conductive filler in an amount as little as 1:50, 1:10, 1:5, 1:3, 1:1, as great as 2:1, 3:1, 5:1, 10:1, 20:1, 50:1, or within any range defined between any of the foregoing values, such as from 1:50 to 50:1, from 1:10 to 10:1, or from 1:5 to 5:1. The TIM 22 may further comprise a ratio of the total of the first and second fillers to the third filler in an amount as little as 1:50, 1:10, 1:5, 1:3, 1:1, as great as 2:1, 3:1, 5:1, 10:1, 20:1, 50:1, or within any range defined between any of the foregoing values, such as from 1:50 to 50:1, from 1:10 to 10:1, or from 1:5 to 5:1.

4. Pretreatment of Thermally Conductive Fillers with a Coupling Agent

In some exemplary embodiments, at least one of the thermally conductive fillers is pretreated with a coupling agent. In some exemplary embodiments, the thermally conductive fillers are not pretreated with a coupling agent. Without wishing to be bound by any theory, it is believed that the coupling agent reacts with both the filler and the polymer matrix material to form or promote a strong bond at the interface, which helps to break the filler particle aggregates and disperse the filler particles in to polymer matrix. The coupling agent is also believed to reduce or prevent separation of the polymer matrix polymer from filler, improving the stability of filler-polymer composite. The coupling agent is further believed to reduce the viscosity of the system and improve the flowability of thermal conductive filler particles, which help to reduce the bond-line thickness (BLT) between the heat generating component and heat spreading component.

In some embodiments, such pretreatment with a coupling agent may be used with high loadings of filler particles may be used with high loadings of the thermally conductive filler, such as 80 wt. %, 85 wt. %, 90 wt. %, 95 wt. %, 99 wt. %, or higher. In some embodiments, such pretreatment with a coupling agent may be used with small particle sizes, such as sub-micron particle sizes, to avoid forming clumps during formulation.

The pretreated thermally conductive filler may comprise the coupling agent in an amount as little as 0.01 wt. %, 0.05 wt. %, 0.1 wt. %, 0.5 wt. %, as great as 1 wt. %, 2 wt. %, 5 wt. %, 10 wt. %, 20 wt. %, or greater, or within any range defined between any two of the foregoing values, based on the weight of the thermally conductive filler.

Exemplary coupling agents for use in pretreatment of the thermally conductive filler include silane coupling agents, titanate coupling agents, aluminate coupling agents, zirconate coupling agents, and stearate coupling agent. In some embodiments, the coupling agent for pre-treatment of the thermally conductive filler is selected from titanate coupling agents, aliphatic coupling agents, and silane coupling agents.

5. Illustrative Mixtures of Thermally Conductive Fillers

The following exemplary embodiments are intended to illustrate mixtures of thermally conductive fillers, and are not to be construed as limiting the scope of the invention in any manner.

In one exemplary embodiment, the thermally conductive filler includes a first thermally conductive filler having a first average particle diameter (D50), a second average particle diameter, and a third average particle diameter. In one more particular embodiment, the first D50 is about 30 microns, the second D50 is about 3 microns, and the third D50 is about 0.3 microns. In another more particular embodiment, the first D50 is about 20 microns, the second D50 is about 3 microns, and the third D50 is about 0.6 microns. In still another more particular embodiment, the first D50 is about 5 microns, the second D50 is about 0.9 microns, and the third D50 is about 20 nm.

In one embodiment, the thermally conductive filler comprises a first thermally conductive filler having a first particle size and a second thermally conductive filler having a second particle size. In one more particular embodiment, the first particle size is from about 8 to about 12 microns and the second particle size is from about 2 to about 5 microns. In a more particular embodiment, the first particle size is about 10 microns and the second particle size is about 3 microns. In another more particular embodiment, the first and second thermally conductive fillers are each aluminum particles.

In a more particular embodiment of the above embodiments, the thermally conductive filler further comprises a third thermally conductive filler having a third particle size. In one more particular embodiment, the third thermally conductive filler has a particle size from about 0.1 microns to about 1 micron and even more particularly about 0.2 microns. In another more particular embodiment, the first thermally conductive filler and second thermally conductive filler are each aluminum and the third thermally conductive filler is zinc oxide.

In another embodiment, the thermally conductive filler comprises a first thermally conductive filler having a first particle size and a second thermally conductive filler having a second particle size. In one more particular embodiment, the first particle size is from about 3 to about 12 microns and the second thermally conductive filler has a particle size from about 0.1 microns to about 1 micron. In a more particular embodiment, the first particle size is about 3 microns and the second particle size is about 0.1-1 micron, and more particularly about 0.2 microns. In another more particular embodiment, the first particle size is about 10 microns and the second particle size is about 0.1-1 micron, and more particularly about 0.2 microns. In another more particular embodiment, the first thermally conductive filler is aluminum and the second thermally conductive filler is zinc oxide.

In a more particular embodiment of the above embodiments, the thermally conductive filler further comprises a third thermally conductive filler having a third particle size. In one more particular embodiment, the third thermally conductive filler has a particle size from about 10 nm to about 0.1 microns and even more particularly about 10 nm to about 50 nm. In another more particular embodiment, the first thermally conductive filler is aluminum, the second thermally conductive filler is zinc oxide, and the third thermally conductive filler is graphene.

b. Polymer Matrix Material

In some exemplary embodiments, the TIM 22 comprises a polymer matrix material. In some exemplary embodiments, the polymer matrix material provides a matrix for incorporating the thermally conductive fillers, and provides flowability when pressed under heat and pressure.

In one exemplary embodiment, the polymer matrix material comprises a hydrocarbon rubber compound or a blend of rubber compounds. Exemplary materials include saturated and unsaturated rubber compounds. In some embodiments, saturated rubbers may be less sensitive to thermal oxidation degradation than unsaturated rubber compounds. Exemplary saturated rubber compounds include ethylene-propylene rubbers (EPR, EPDM), polyethylene/butylene, polyethylene-butylene-styrene, polyethylene-propylene-styrene, hydrogenated polyalkyldiene "mono-ols" (such as hydrogenated polybutadiene mono-ol, hydrogenated polypropadiene mono-ol, hydrogenated polypentadiene mono-ol), hydrogenated polyalkyldiene "diols" (such as hydrogenated polybutadiene dial, hydrogenated polypropadiene diol, hydrogenated polypentadiene diol) and hydrogenated polyisoprene, polyolefin elastomer, or any other suitable saturated rubber, or blends thereof. In one embodiment, the polymer matrix material is a hydrogenated polybutadiene mono-ol, which may also be referred to as a hydroxyl-terminated ethylene butylene copolymer, specialty mono-ol.

In one exemplary embodiment, the polymeric matrix material comprises a silicone rubber, a siloxane rubber, a siloxane copolymer or any other suitable silicone-containing rubber.

In some exemplary embodiments, the TIM 22 may comprise the polymer matrix material in an amount as little as 1 wt. %, 3 wt. %, 5 wt. %, 10 wt. %, as great as 15 wt. %, 25 wt. %, 50 wt. %, 75 wt. %, or within any range defined between any two of the foregoing values, based on the total weight of the TIM 22.

c. Phase Change Material

In some exemplary embodiments, the TIM 22 comprises one or more phase change materials. A phase change material is a material having a melting point or melting point range at or below the operating temperature of a portion of an electronic device in which the TIM 22 is to be used. An exemplary phase change material is a wax, such as paraffin wax. Paraffin waxes are a mixture of solid hydrocarbons having the general formula $C_nH_{2n+2}$ and having melting points in the range of about 20° C. to 100° C. Polymer waxes include polyethylene waxes and polypropylene waxes, and typically have a range of melting points from about 40° C. to 160° C. Other exemplary phase change materials include low melting alloys, such as Wood's metal, Field's metal, or a metal or alloy having a melting point between about 20° C. and 90° C.

In some embodiments, the amount of phase change material can be used to can adjust the hardness of the TIM 22. For example, in some embodiments wherein the loading of the phase change material is low, the composition may be in the form of a soft gel, and in some embodiments wherein the loading of the phase change material is high, the composition may be a hard solid. The TIM 22 may comprise the one or more phase change materials in an amount as little as 1 wt. %, 3 wt. %, 5 wt. %, 10 wt. %, as great as 15 wt. %, 25 wt. %, 50 wt. %, 75 wt. %, or within any range defined between any two of the foregoing values, based on the total weight of the TIM 22.

d. Coupling Agent

In some exemplary embodiments, the TIM 22 comprises one or more coupling agents. In some exemplary embodiments, inclusion of a coupling agent may improve thermal properties, such as properties at relatively high temperatures. Exemplary coupling agents include titanate coupling agents, such as those disclosed in US Patent Application Publication 2011/0308782, the disclosure of which is hereby incorporated by reference in its entirety. Exemplary coupling agents include: titanium IV 2,2 (bis 2-propenolatomethyl)butanolato, tris(dioctyl)pyrophosphato-O; zirconium IV 2,2 (bis 2-propenolatomethyl)butanolato, tris(diisooctyl)pyrophosphato-O; titanium IV 2-propanolato, tris(dioctyl)-pyrophosphato-O) adduct with 1 mole of diisooctyl phosphite; titanium IV bis(dioctyl)pyrophosphato-O, oxoethylenediolato, (Adduct), bis(dioctyl) (hydrogen)phosphite-O; titanium IV bis(dioctyl)pyrophosphato-O, ethylenediolato (adduct), bis(dioctyl)hydrogen phosphite; and zirconium IV 2,2-bis(2-propenolatomethyl) butanolato, cyclo di[2,2-(bis 2-propenolatomethyl) butanolato], pyrophosphato-O,O. In one exemplary embodiment, the coupling agent is titanium IV 2,2 (bis 2-propenolatomethyl) butanolato, tris(dioctyl)pyrophosphato-O.

In one embodiment, the coupling agent is the same as the coupling agent for the pre-treatment of the thermally conductive filler. In another embodiment, the coupling agent is a different coupling agent than the coupling agent for the pre-treatment of the thermally conductive filler.

In some exemplary embodiments, the TIM 22 may comprise the one or more coupling agents in an amount as little as 0.1 wt. %, 0.3 wt. %, 0.5 wt. %, as great as 1 wt. %, 2 wt. %, 3 wt. %, 5 wt. %, or within any range defined between any two of the foregoing values, based on the total weight of the central layer.

e. Additives

In some exemplary embodiments, the TIM 22 comprises one or more additives. Exemplary additives include antioxidants, ion scavengers, and crosslinkers.

Exemplary antioxidants include phenolic-type antioxidants, amine-type antioxidants, or any other suitable type of antioxidant or combinations thereof. In some exemplary embodiments, the TIM 22 may comprise the one or more antioxidants in an amount as little as 0.1 wt. %, 0.5 wt. %, 1 wt. % as great as 1.5 wt. %, 2 wt. %, 5 wt. %, 10 wt. %, or within any range defined between any two of the foregoing values, based on the total weight of the TIM.

Exemplary ion scavengers are disclosed in PCT application number PCT/CN2014/081724, the disclosure of which is hereby incorporated by reference in its entirety. In some exemplary embodiments, the TIM 22 may comprise the one or more ion scavengers in an amount as little as 0.1 wt. %, 0.5 wt. %, 1 wt. % as great as 1.5 wt. %, 2 wt. %, 5 wt. %, 10 wt. %, or within any range defined between any two of the foregoing values, based on the total weight of the TIM.

Exemplary crosslinkers are disclosed in U.S. Pat. No. 7,244,491, the disclosure of which is hereby incorporated by reference in its entirety. Exemplary crosslinkers include alkylated melamine resins. In some exemplary embodiments, the TIM 22 may comprise the one or more crosslinkers in an amount as little as 0.1 wt. %, 0.5 wt. %, 1 wt. % as great as 1.5 wt. %, 2 wt. %, 5 wt. %, 10 wt. %, or within any range defined between any two of the foregoing values, based on the total weight of the TIM.

B. Methods of Forming a Thermal Interface Material

In some embodiments, the TIM 22 is formed from a dispensable formulation including one or more polymer matrix materials, one or more phase change materials, two or more thermally conductive fillers, one or more solvents, and, optionally, one or more additives.

Exemplary solvents are described in U.S. Patent Application Publication 2007/0517733, the disclosure of which is hereby incorporated by reference herein in its entirety. Suitable solvents include pure solvents or mixtures of organic or inorganic solvents that are volatilized at a desired temperature, such as the critical temperature, or that can facilitate any of the above-mentioned design goals or needs, and that are compatible with the phase change materials, in that they will interact with the phase change materials to achieve the previously-mentioned goals. In some embodiments, the solvent, solvent mixture or combination thereof will solvate the phase change material such that it can be applied by printing techniques. In some exemplary embodiments, the solvent or mixture of two or more solvents are selected from the hydrocarbon family of solvents. Hydrocarbon solvents comprise carbon and hydrogen. A majority of hydrocarbon solvents are non-polar; however, there are a few hydrocarbon solvents that are considered polar.

Hydrocarbon solvents are generally classified into three classes: aliphatic, cyclic and aromatic. Aliphatic hydrocarbon solvents comprise both straight-chain compounds and compounds that are branched and possibly crosslinked, however, aliphatic hydrocarbon solvents are not typically considered cyclic. Cyclic hydrocarbon solvents are those solvents that comprise at least three carbon atoms oriented in a ring structure with properties similar to aliphatic hydrocarbon solvents. Aromatic hydrocarbon solvents are those solvents that comprise generally three or more unsaturated bonds with a single ring or multiple rings attached by a common bond and/or multiple rings fused together. In some exemplary embodiments, the solvent or mixture of two or more solvents are selected from solvents that are not considered part of the hydrocarbon solvent family of compounds, such as ketones, alcohols, esters, ethers and amines. In yet other contemplated embodiments, the solvent or solvent mixture may comprise a combination of any of the solvents mentioned herein.

Exemplary hydrocarbon solvents include toluene, xylene, p-xylene, m-xylene, mesitylene, solvent naphtha H, solvent naphtha A, Isopar H and other paraffin oils and isoparaffinic fluids, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, nitrated hydrocarbons, benzene, 1,2-dimethylbenzene, 1,2,4-trimethylbenzene, mineral spirits, kerosene, isobutylbenzene, methylnaphthalene, ethyltoluene, ligroine. Exemplary ketone solvents include acetone, diethyl ketone, methyl ethyl ketone and the like.

In one exemplary embodiment, the solvent includes one or more solvents selected from: pentane, hexane, heptane, cyclohexane, paraffin oils, isoparaffinic fluids, benzene, toluene, xylene and mixtures or combinations thereof.

In some exemplary embodiments, the formulation may comprise the one or more solvents in an amount as little as 0.1 wt. %, 0.5 wt. %, 1 wt. % as great as 5 wt. %, 10 wt. %, 20 wt. %, or within any range defined between any two of the foregoing values, based on the total weight of the formulation.

In some exemplary embodiments, a method of forming a TIM 22 is provided. In some exemplary embodiments, forming the TIM 22 includes processes such as baking and drying the TIM 22.

In some exemplary embodiments, baking the TIM 22 include baking at a temperature as low as 25° C., 50° C., 75° C., 80° C., as high as 100° C., 125° C., 150° C., 170° C., or within any range defined between any two of the foregoing values. In some exemplary embodiments, the TIM 22 is baked for as little as 0.5 minutes, 1 minute, 30 minutes, 1 hour, 2 hours, as long as 8 hours, 12 hours, 24 hours, 36, hours, 48 hours, or within any range defined between any two of the foregoing values.

C. Thermal Interface Material Properties

In some exemplary embodiments, the TIM 22 has a thermal impedance as little as 0.05° C.·cm$^2$/W, 0.06° C.·cm$^2$/W, 0.07° C.·cm$^2$/W, 0.75° C.·cm$^2$/W, as high as 0.08° C.·cm$^2$/W, 0.09° C.·cm$^2$/W, 0.1° C.·cm$^2$/W, 0.12° C.·cm$^2$/W, or within any range defined between any two of the foregoing values.

In some exemplary embodiments, the TIM 22 has a thermal impedance following conditioning at a temperature of 130° C. and a relative humidity of 85% for 96 hours that is no more than 20% greater, no more than 10% greater, no more than 5% greater, or no more than the thermal impedance of the TIM 22 prior to said conditioning.

In some exemplary embodiments, the TIM 22 has a thermal impedance following conditioning at a temperature of 150° C. for 1000 hours that is no more than 20% greater, no more than 10% greater, no more than 5% greater, or no more than the thermal impedance of the TIM 22 prior to said conditioning.

The final thickness of the applied TIM, following application between the heat generating and heat dissipating components, is referred to as the bond line thickness (BLT). The value of the BLT is determined, in part, by the flowability of the TIM when being heated by the heat generating component. Phase change materials (PCM) include a wax or other material to be increase the flowability of the TIM when heated by the heat generating component, which in turn reduced the BLT. BLT is related to thermal impedance (TI) and thermal conductivity (TC) by the formula TI=BLT/TC, such that lower BLT results in lower thermal impedance at the same thermal conductivity. Without wishing to be bound by any particular theory, it is believed that including multiple sizes of thermally conductive fillers allows smaller particle sizes to fill gaps present between larger particle sizes, increasing the flowability of the TIM and reducing the BLT. TIM formulations having low BLT tend to have low thermal impedance.

In some embodiments, when subjected to a pressure of 40 psi and heated to 80° C., the TIM 22 has a bond line thickness as great as 80 microns, 70 microns, 60 microns, 50 microns, 40 microns, as little as 30 microns, 25 microns, 20 microns, 15 microns, 10 microns, 5 microns, or less, or within any range defined between any two of the foregoing values, such as from 80 microns to 5 microns, from 60 microns to 10 microns, or from 30 to 20 microns.

EXAMPLES

Examples including a rubber elastomer, a first thermally conductive filler (aluminum particles between about 0.1 and about 25 microns), a second thermally conductive filler (zinc oxide particles between about 0.1 and 6 microns), a titanate coupling agent, an antioxidant, and a wax, were prepared as described below. Examples 1-5 generally contained about 65-75 wt. % of the aluminum filler and about 13-15 wt. % of the zinc oxide filler. Examples 6-13 generally contained about 50-80 wt. % of the aluminum filler and about 15-45 wt. % of the zinc oxide filler.

Example 1 and Comparative Example 1 were prepared according to the formulations (in weight percent) provided in Table 1.

TABLE 1

Formulations for Example 1 and Comparative Example 1

|  | Ex. 1 | Comp. Ex. 1 |
|---|---|---|
| Elastomer (wt. %) | 8.6 | 8.6 |
| Wax (wt. %) | 3.1 | 3.1 |
| Antioxidant (wt. %) | 0.2 | 0.2 |
| Titanate coupling agent (wt. %) | 1.1 | 1.1 |
| Aluminum(wt. %) (5 μm) | 72.5 | 87 |
| Zinc oxide (wt. %) (0.6 μm) | 14.5 | 0 |
| Thermal impedance (° C. · cm$^2$/W) | 0.091 | 0.103 |

To prepare Example 1, a Kraton elastomer (a hydroxyl-terminated ethylene butylene copolymer, specialty monool), a microcrystalline wax with a melting point of about 45°

C., and an antioxidant were combined and blended in a heated mixer until the combination had melted and obtained a substantially homogeneous appearance. The titanium IV 2,2 (bis 2-propenolatomethyl) butanolato, tris(dioctyl)pyrophosphato-O coupling agent was added, and the combination was again blended until the combination had a substantially homogeneous appearance. The aluminum powder and zinc oxide were added, followed by blending until the mixture had a substantially homogeneous appearance.

Comparative example 1 was prepared similarly to Example 1, except that the mixture of thermally conductive fillers in Example 1 was replaced with aluminum powder.

The thermal impedance of each TIM was determined using a cut bar test according to ASTM D5470-06. Each TIM was taped between two liner films at 90° C. for 15 minutes. The liners were removed and a 25 mm diameter circle sample was cut from the TIM. The sample was placed between two nickel-coated copper bars, and placed under a pressure of 40 psi. The power was set to 125 W, and the thermal properties were measured at 20 minutes, 25 minutes, and 30 minutes. The average of the three values was used to determine the thermal impedance value provided in Table 1.

As shown in Table 1, partially replacing some of the aluminum in comparative example 1 with an equivalent weight percent of zinc oxide led to a decrease in thermal impedance of 0.012° C.·cm²/W.

Examples 2-4 and Comparative Example 2 were prepared according to the formulations provided in Table 2.

TABLE 2

Formulations for Examples 2-4 and Comparative Example 2

|  | Ex. 2 | Ex. 3 | Ex. 4 | Comp. Ex. 2 |
|---|---|---|---|---|
| Elastomer (wt. %) | 8.7 | 8.7 | 8.7 | 8.7 |
| Wax (wt. %) | 3.1 | 3.1 | 3.1 | 3.1 |
| Antioxidant (wt. %) | 0.1 | 0.1 | 0.1 | 0.1 |
| Amino resin (wt. %) | 0.6 | 0.6 | 0.6 | 0.6 |
| Titanate coupling agent (wt. %) | 1.5 | 1.5 | 1.5 | 1.5 |
| Aluminum (wt. %) (3 μm) | 71.67 | 71.67 | 71.67 | 71.67 |
| Zinc oxide* (wt. %) (0.9 μm) | 14.33 | 14.33 | 14.33 | 14.33 |
| Thermal impedance (° C. · cm²/W) | 0.106 | 0.079 | 0.115 | 0.098 |

*Note:
in Ex. 2-4, Zinc Oxide was pre-treated with a coupling agent

To prepare Example 2, a Kraton elastomer (a hydroxyl-terminated ethylene butylene copolymer, specialty monool), a microcrystalline wax with a melting point of about 45° C., an antioxidant, and an amino resin were combined and blended in a heated mixer until the combination had melted and obtained a substantially homogeneous appearance. The titanium IV 2-propanolato, tris isooctadecanoato-O coupling agent was added, and the combination was again blended until the combination had a substantially homogeneous appearance. The aluminum powder and zinc oxide pre-treated with a titanate coupling agent were added, followed by blending until the mixture had a substantially homogeneous appearance.

Example 3 was prepared similarly to Example 2, except that the zinc oxide was pre-treated with an aliphatic coupling agent rather than a titanate coupling agent. Example 4 was prepared similarly to Example 2, except that the zinc oxide was pre-treated with a silane coupling agent rather than a titanate coupling agent. Comparative Example 2 was prepared similarly to Example 2, except that the zinc oxide was not pre-treated.

The thermal impedance of each TIM was determined using a cut bar test according to ASTM D5470-06 as described above. The thermal impedance values are provided in Table 2. As shown in Table 2, pretreating the zinc oxide with an aliphatic coupling agent led to a decrease in thermal impedance compared to pre-treatment with either the titanate coupling agent or the silane coupling agent.

Examples 5-10 were prepared according to the formulations provided in Table 3.

TABLE 3

Formulations for Examples 5-10 and Properties of Comparative Example 3

|  | Ex. 5 | Ex. 6 | Ex. 7 | Ex. 8 | Ex. 9 | Ex 10 | Comp Ex. 3 | Comp Ex. 4 | Comp Ex. 5 |
|---|---|---|---|---|---|---|---|---|---|
| Elastomer (wt. %) | 6.2 | 5.27 | 4.6 | 4.6 | 3.94 | 3.94 | 4.6 | 5.42 | — |
| Wax (wt. %) | 1.4 | 1.5 | 1.31 | 1.31 | 1.12 | 1.12 | 1.31 | 1.50 | — |
| Antioxidant (wt. %) | 0.1 | 0.42 | 0.37 | 0.37 | 0.31 | 0.31 | 0.37 | 0.4 | — |
| Titanate coupling agent (wt. %) | 1.3 | 0.57 | 0.72 | 0.72 | 0.74 | 0.74 | 0.72 | 0.68 | — |
| Aluminum (wt. %) (6.7 μm) | 74 | 76.9 | 77.5 | 67.13 | 78.24 | 67.06 | 67.13 | 92 | — |
| Zinc oxide (wt. %) (0.9 μm) | 17 | 15.34 | 15.5 | 25.87 | 15.65 | 26.83 | — | — | — |
| Alumina (0.8 μm) (wt. %) | — | — | — | — | — | — | 25.87 | — | — |
| Filler loading (wt. %) | 91 | 92 | 93 | 93 | 94 | 94 | 93 | 92 | — |
| Bond line thickness (μm) | — | — | — | 25 | — | 28 | 28 | 30 | — |

TABLE 3-continued

Formulations for Examples 5-10 and Properties of Comparative Example 3

|  | Ex. 5 | Ex. 6 | Ex. 7 | Ex. 8 | Ex. 9 | Ex 10 | Comp Ex. 3 | Comp Ex. 4 | Comp Ex. 5 |
|---|---|---|---|---|---|---|---|---|---|
| Thermal impedance (° C. · cm²/W) | — | — | — | 0.07 | — | 0.08 | 0.09 | 0.09 | 0.1 |

To prepare Examples 5-10, a Kraton elastomer (a hydroxyl-terminated ethylene butylene copolymer, specialty mono-ol), a microcrystalline wax with a melting point of about 45° C., and an antioxidant, were combined according to the amounts given in Table 3 and blended in a heated mixer until the combination had melted and obtained a substantially homogeneous appearance. The titanium IV 2, 2 (bis 2-propenolatomethyl) butanolato, tris(dioctyl)pyrophosphato-O coupling agent was added, and the combination was again blended until the combination had a substantially homogeneous appearance. The aluminum powder and zinc oxide were added, followed by blending until the mixture had a substantially homogeneous appearance.

Comparative Example 3 was prepared similarly to Examples 5-10, except that alumina was used in place of the zinc oxide.

Comparative Example 4 was prepared similarly to Examples 5-10, except that the mixture of thermally conductive fillers was replaced with aluminum powder.

Comparative Example 5 was a commercially available PTM 3180 material, available from Honeywell International, Inc.

Each TIM was taped between two liner films at 90° C. for 15 minutes. The liners were removed and a 25 mm diameter circle sample was cut from the TIM. The sample was placed between a nickel-coated copper spreader and a silicone die, creating a test "sandwich" sample.

The sample was subjected to a 90° C. baking oven under 40 psi pressure, for 60 minutes using an Oven D2F-6050, supplied by Shanghai JINGHONG. The "sandwich" was measured with micrometer and the reading is the total thickness of silicone die—TIM—nickel-coated copper. The thickness of silicon die and nickel-coated copper was measured with micrometer in advance to obtain the bond-line thickness of the TIM (BLT). TIM formulations having good compressibility can be compressed to a very thin sample, measured as a very low BLT, and tend to have low thermal impedance.

The thermal impedance of each TIM was determined using a flash diffusivity of the test sandwich. Flash diffusivity was determined according to ASTM E1461 using a Netzsch LFA 447 equipment with a Xenon light source. The results are provided in Table 3.

As is shown in Table 3, the Examples including both aluminum particles and zinc oxide particles had lower thermal impedance than the Comparative Examples having only aluminum particles.

In addition, comparing the results of Example 8 with that of Comparative Example 4, Example 8 has lower BLT than Comparative Example 4, even though Example 8 has a higher filler loading (93%) than Comparative Example 4 (92%). This indicates that Example 8 has better compressibility than Comparative Example 4, despite the higher filler loading, which may lead to the lower thermal impedance.

Further, comparing the results of Example 8 with that of Comparative Example 3, the samples had similar filler loadings, but Example 8 used aluminum and zinc oxide particles, while comparative example 3 had aluminum and alumina particles. As shown in Table 3, Example 8 had lower BLT than Comparative Example 3, indicating better compressibility. Lower thickness as measure by BLT is related to thermal impedance by the formula TI=BLT/TC, where TI is thermal impedance, BLT is bond line thickness, and TC is thermal conductivity.

Example 8 was tested using a Highly Accelerated Stress Test (HAST test) in which the sample was conditioned at a temperature of 130° C. and a relative humidity of 85% for 96 hours in an environmental chamber supplied by ESPEC. The thermal impedance of the sample was measured before or after the sample conditioning. An increase of less than 20% in thermal impedance indicated a passing HAST result, while an increase of 20% or more indicated a failing HAST result. As shown in Table 4, Example 8 passed the HAST test.

TABLE 4

HAST results

| Materials | Sample No | Thermal Impedance (AC) | Thermal Impedance (HAST96 hr) |
|---|---|---|---|
| Example 8 | 1 | 0.08 | 0.08 |
|  | 2 | 0.08 | 0.08 |
|  | 3 | 0.08 | 0.08 |
|  | 4 | 0.08 | 0.08 |

Example 8 was also tested using a baking test in which the sample was conditioned at a temperature of 150° C. for 1000 hours in an environmental chamber supplied by ESPEC. The thermal impedance of the sample was measured before or after the sample conditioning. An increase of less than 20% in thermal impedance indicated a passing baking test result, while an increase of 20% or more indicated a failing baking test result. As shown in Table 5, Example 8 passed the HAST test.

TABLE 5

HAST results

| Materials | Sample No | Thermal Impedance (AC) | Thermal Impedance (150° C. baking/1000 hr) |
|---|---|---|---|
| Example 8 | 1 | 0.07 | 0.07 |
|  | 2 | 0.08 | 0.07 |
|  | 3 | 0.08 | 0.07 |
|  | 4 | 0.07 | 0.07 |

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A thermal interface material comprising:
   at least one polymer;
   at least one phase change material including at least one wax;
   a first thermally conductive metal filler having a first particle size between 1 and 25 microns:
   a second thermally conductive metal filler having a second particle size between 1 and 10 microns, wherein the first particle size is larger than the second particle size, the first and second thermally conductive fillers being different sized particles of the same material:
   a third thermally conductive filler different from the first and second thermally conductive fillers and having a third particle size between 0.5 and 1 micron; and all thermally conductive fillers being present in a total amount of between 90 wt. % and 99 wt. %, based on the total weight of the thermal interface material; and
   wherein the thermal interface material has a bond line thickness (BLT) between 5 and 80 microns when subjected to a pressure of 40 psi and heated to 80° C.

2. The thermal interface material of claim 1, wherein the first and second thermally conductive fillers each comprise aluminum particles.

3. The thermal interface material of claim 1, wherein the third thermally conductive filler comprises zinc oxide particles.

4. The thermal interface material of claim 1, wherein the first particle size is between 1 and 15 microns.

5. The thermal interface material of claim 1, wherein the second particle size is between 1 and 5 microns.

6. The thermal interface material of claim 1, wherein the third particle size is between 0.7 and 0.9 microns.

7. The thermal interface material of claim 1, wherein the first particle size is between 1 and 15 microns and the second particle size is between 1 and 5 microns.

8. The thermal interface material of claim 7, wherein the first and second thermally conductive filler each comprise aluminum and the third thermally conductive filler comprises zinc oxide.

9. The thermal interface material of claim 1, further comprising at least one coupling agent.

10. The thermal interface material of claim 9, wherein the coupling agent is a titanate coupling agent.

11. The thermal interface material of claim 1, further comprising at least one antioxidant.

12. The thermal interface material of claim 1, further comprising at least one ion scavenger.

13. The thermal interface material of claim 1, further comprising at least one crosslinker.

14. The thermal interface material of claim 1, wherein the at least one polymer includes a hydrogenated polybutadiene mono-ol.

15. The thermal interface material of claim 1, wherein the at least one wax includes a hydrocarbon wax.

* * * * *